(12) United States Patent
Pau et al.

(10) Patent No.: US 6,635,573 B2
(45) Date of Patent: Oct. 21, 2003

(54) METHOD OF DETECTING AN ENDPOINT DURING ETCHING OF A MATERIAL WITHIN A RECESS

(75) Inventors: Wilfred Pau, Santa Clara, CA (US); Meihua Shen, Fremont, CA (US); Jeffrey D. Chinn, Foster City, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 10/040,109

(22) Filed: Oct. 29, 2001

(65) Prior Publication Data

US 2003/0082919 A1 May 1, 2003

(51) Int. Cl.$^7$ .............................................. H01L 21/302
(52) U.S. Cl. ...................................................... 438/689
(58) Field of Search ................................ 438/709, 714, 438/9, 183, 689

(56) References Cited

U.S. PATENT DOCUMENTS

| | | | | |
|---|---|---|---|---|
| 4,618,262 A | * | 10/1986 | Maydan et al. | 356/357 |
| 5,759,919 A | * | 6/1998 | Liu | 438/694 |
| 5,767,018 A | * | 6/1998 | Bell | 438/696 |
| 6,081,334 A | | 6/2000 | Grimbergen et al. | 356/357 |
| 6,228,277 B1 | * | 5/2001 | Kornblit et al. | 216/60 |
| 6,403,426 B1 | * | 6/2002 | Montree et al. | 438/291 |

OTHER PUBLICATIONS

G. Kaplita et al., "Polysilicon Plug Recess Etch Process for Sub–Quarter Micron Devices", *Electrochemical Society Proceedings*, vol. 99–30, pp. 212–219 (1999).

G. Kaplita et al., "Polysilicon planarization and plug recess etching in a Decoupled Plasma Source Chamber using two endpoint techniques", *SPIE*, vol. 3882, pp. 90–97 (Sep. 1999).

N. Layadi et al. "Interferometry for end point prediction during plasma etching of various structures in complementary metal–oxide–semiconductor device fabrication", *J. Vac, Sci. Technol.*, B 17(6), pp. 2630–2637 (Nov./Dec. 1999.)

* cited by examiner

*Primary Examiner*—Hoai Ho
*Assistant Examiner*—Quoc Hoang
(74) *Attorney, Agent, or Firm*—Shirley L. Church; Joseph Bach; Kathi Bean

(57) ABSTRACT

We have discovered a method of detecting the approach of an endpoint during the etching of a material within a recess such as a trench or a contact via. The method provides a clear and distinct inflection endpoint signal, even for areas of a substrate containing isolated features. The method includes etching the material in the recess and using thin film interferometric endpoint detection to detect an endpoint of the etch process, where the interferometric incident light beam wavelength is tailored to the material being etched; the spot size of the substrate illuminated by the light beam is sufficient to provide adequate signal intensity from the material being etched; and the refractive index of the material being etched is sufficiently different from the refractive index of other materials contributing to reflected light from the substrate, that the combination of the light beam wavelength, the spot size, and the difference in refractive index provides a clear and distinct endpoint signal.

29 Claims, 7 Drawing Sheets

METHOD OF DETECTING AN ENDPOINT DURING ETCHING OF A MATERIAL WITHIN A RECESS

BACKGROUND OF THE INVENTION

1. Field of the Invention present invention pertains to a method of etching a material within a recess (such as a trench or contact via). In particular, the present invention pertains to a method for detecting the approach of an endpoint during the etching of polysilicon within a recess. The method of the invention is particularly useful in the formation of metal gate structures.

2. Brief Description of the Background Art

The use of metal gates within semiconductor structures is a relatively new concept in the art of semiconductor manufacture. There are numerous difficulties inherent in the formation of a metal gate structure which have yet to be addressed. In forming a metal gate structure, a metal-containing gate layer is typically deposited over a thin gate dielectric layer, which overlies a semiconductor structure. As semiconductor manufacturing technology advances, gate dielectric layers are becoming thinner and thinner. For example, the current standard thickness for a silicon oxide gate dielectric layer is about 15 Å to about 30 Å. When tantalum pentoxide is used, the thickness of the gate dielectric layer may be lower than when silicon oxide is used.

In the past, a metal gate has been formed by pattern etching a metal layer. Pattern etching of the metal gate layer must be carried out without etching through or otherwise damaging a very thin underlying dielectric layer. This requires an etch process which has a high selectivity for etching the metal layer relative to the underlying dielectric layer. Further, it has been important to have a very sensitive endpoint detection system that can determine when the etching process is approaching completion. The metal etch process can then be stopped before damage is done to the underlying dielectric layer.

A state of the art endpoint detection system is described in commonly owned U.S. Pat. No. 6,081,334, to Grimbergen et al. Grimbergen et al. provides detection of the endpoint during etching of a layer of material, deposition of a CVD layer, or deposition of a PVD layer, for example. The intensity of an incident light beam reflected from a layer on a substrate is measured over time, to determine a measured waveform pattern. The measured waveform pattern is compared to a predetermined characteristic waveform pattern, and when the two waveform patterns are similar or substantially the same, the process conditions are changed to change a process variable before the entire layer is completely processed (Abstract). The thin film interferometry endpoint detection technique described by Grimbergen et al. provides a very clear (inflection) endpoint.

Unfortunately, it is difficult to determine the endpoint for etching a metal layer relative to an underlying layer using the thin film interferometry endpoint detection technique disclosed by Grimbergen et al. Metals are reflective, rather than transparent, and the thin film interferometry technique relies on the reflectivity of the underlying layer relative to the overlying layer. If the overlying layer is highly reflective, the reflective component from an underlying layer may be masked, so that the technique does not work well.

The present process for forming a metal gate involves the replacement of a polysilicon fill layer formed in a trench with a metal layer. The sidewalls of the trench comprise a dielectric material (such as silicon oxide or silicon nitride) and the base of the trench is a thin gate dielectric layer, which overlies a semiconductor substrate (which is typically single-crystal silicon). The process requires complete removal of the polysilicon from the trench prior to deposition of the metal gate layer. Removal of the polysilicon from the trench requires recess etching of the polysilicon relative to the underlying gate dielectric layer. This method is used to avoid the need for etching a metal gate layer relative to an underlying thin gate dielectric layer.

Kaplita et al. (*Electrochemical Society Proceedings*, Vol. 99–30, pp. 213–219; *Proceedings of the SPIE Conference on Process, Equipment, and Materials Control in Integrated Circuit Manufacturing V*, Vol. 3882, pp. 90–97, 1999) have described the use of a multi-layer interferometry endpoint detection technique to signal the endpoint for recess etching of polysilicon within a shallow trench formed in a single-crystal silicon substrate, with no underlying gate dielectric layer. The technique was designed to signal the endpoint for recess etching of polysilicon in a trench having a depth of less than about 4000 Å. It is desired to have the endpoint of the polysilicon etch process be signaled when less than about 500 Å of polysilicon remains within the trench. The multi-layer interferometry endpoint detection technique used by Kaplita et al. records the interference from two reflective surfaces to calculate depth and etch rate using a depth-specific algorithm. Representative endpoint traces obtained using the multi-layer interferometry endpoint detection technique are shown in FIGS. 5 and 6. As shown in FIGS. 5 and 6, the Kaplita et al. endpoint detection technique provides a sinusoidal wave pattern of decreasing amplitude. There is no single inflection point which indicates a distinct endpoint for polysilicon etching.

The thin film interferometry endpoint detection technique described by Grimbergen et al. in U.S. Pat. No. 6,081,334 has been used to signal the endpoint for etching back a layer of polysilicon relative to a thin, underlying silicon oxide layer, where both layers are on a flat surface (Col. 5, line 51, through Col. 8, line 35). When an incident light beam strikes a layer of polysilicon, a portion of the light beam is reflected off the top surface of the polysilicon, and the remaining portion of the light beam is absorbed into the polysilicon. When a polysilicon layer is very thick, the portion of the incident light beam that is absorbed by the polysilicon is attenuated through the thickness of the polysilicon. However, as polysilicon gets thinner (i.e., less than about 500 Å thick), it becomes more transparent. As the polysilicon layer becomes more transparent, the absorbed light is able to travel through the polysilicon and reflect off the top surface of an underlying reflective layer. The reflected light then travels back through the polysilicon layer to a detector above the polysilicon layer surface. The detector senses a change in the total amount of light reflected off the surface of the polysilicon, which indicates that the polysilicon etch is approaching completion, and the surface of the underlying reflective layer is approaching. FIG. 4 shows the waveform spectra of reflected light beams at different wavelengths during etching of a layer of polysilicon overlying a silicon oxide layer, where both layers are on a flat surface. Note the distinct inflection point recorded at 365 nm (curve 430) as the endpoint for etching the polysilicon layer draws near, and light has begun to reflect off the underlying silicon oxide layer.

Although the Grimbergen technique described above can provide a distinct endpoint for etching back a flat surface layer of polysilicon relative to an underlying dielectric layer, problems were anticipated in using this technique to detect the endpoint for recess etching of polysilicon within a trench. Because a large portion (generally in excess of 50%, and typically in excess of about 70%) of the substrate surface is covered by a dielectric material (typically silicon oxide), it was expected that the magnitude of the incident light reflecting off the dielectric substrate surface would obscure the relatively small change in the amount of reflected light associated with etching of the polysilicon in the polysilicon-filled trenches. This problem was anticipated to be especially significant in isolated feature areas of the substrate, where the number of polysilicon-filled trenches per unit area is small.

Due to the potential problems with use of the Grimbergen method to detect an endpoint for etching polysilicon in a trench, and due to the inability of the Kaplita et al. method to provide a distinct endpoint for etching polysilicon within a trench, we began work on an endpoint detection method which could be used to detect the endpoint for etching polysilicon in a recess.

SUMMARY OF THE INVENTION

We have discovered a method of detecting the approach of an endpoint during the etching of a material within a recess such as a trench or a contact via. The method provides a clear and distinct inflection endpoint signal, even for areas of a substrate containing isolated features. The method of etching the material in the recess employs thin film interferometric endpoint detection where the interferometric incident light beam wavelength is tailored to the material being etched; the spot size of the substrate illuminated by the light beam is sufficient to provide adequate signal intensity from the material being etched; and the refractive index of the material being etched is sufficiently different from the refractive index of other materials contributing to reflected light from the substrate surface that the combination of light beam wavelength, spot size and difference in refractive index provides a clear and distinct inflection end point signal.

In one embodiment of the invention, polysilicon is etched within a recess. According to this embodiment, a first polysilicon etch step is performed, using an aggressive etch chemistry and processing conditions, to rapidly remove a first portion of the polysilicon from the recess. An endpoint to the first polysilicon etch step is detected using a thin film interferometry endpoint detection technique, where the light beam wavelength ranges from about 350 nm to about 400 nm; the spot size diameter is larger than about 6 mm, and is typically about 8 mm to about 10 mm; and the difference in refractive index between the polysilicon and the material which makes up the majority of the substrate surface which is illuminated is about 1.0 or greater, and is typically about 1.4 or greater. This endpoint detection method may be used for etching of polysilicon within a recess, even when the feature sizes are as small as about 0.1 $\mu$; the aspect ratio (ratio of the recess wall height to the recess feature size) is about 2; and the spacing between features is about 0.3 $\mu$, by way of example and not by way of limitation.

Subsequent to the first polysilicon etch step, a less aggressive etch chemistry may be used in a timed etch process to remove the remaining polysilicon from the bottom of the recess, to expose an upper surface of a different material underlying the polysilicon. The second plasma source gas provides a selectivity (i.e., preference) for etching the polysilicon relative to the underlying material of at least 100:1. The etch chemistry and processing conditions used in the second, timed polysilicon etch step provide more controlled etching of the polysilicon layer and a greater selectivity for etching the polysilicon layer relative to the underlying material layer. When recess etching of polysilicon is performed according to the method, an upper surface of the underlying layer (typically a thin gate dielectric layer) is exposed, but not punched through.

The method of the invention is particularly useful for recess etching of polysilicon in the formation of a metal gate structure.

DETAILED DESCRIPTION OF THE EXEMPLARY EMBODIMENTS

Disclosed herein is a method of detecting an endpoint during etching a first material which is present in a recess within a second material. The endpoint detection method employs a thin film interferometry endpoint detection technique where the interferometric incident light beam wavelength is tailored to the material being etched; the spot size of the substrate illuminated by the light beam is sufficient to provide adequate signal intensity from the material being etched; and the refractive index of the material being etched is sufficiently different from the refractive index of other materials contributing to reflected light from the substrate surface, that the combination of light beam wavelength, spot size and difference in refractive index provides a clear and distinct inflection end point signal. This endpoint detection method may be used for etching of polysilicon within a recess, even when the feature sizes are as small as about 0.1µ; the aspect ratio (ratio of the recess wall height to the recess feature size) is about 2; and the spacing between features is about 0.3µ, by way of example and not by way of limitation. In particular, the endpoint detection method is particularly useful for etching a material in a recess having a feature size of less than about 0.18µ and an aspect ratio of greater than 1.0. In one embodiment of the invention polysilicon present in a recess having a feature size of about 0.1 to about 0.12µ was etched from an initial thickness of about 1,500 Å to a desired residual thickness of about 150 Å using the endpoint detection method of the invention. At the bottom of the recess was a thin layer of silicon oxide, which was overlying a single crystal silicon substrate. The endpoint to the polysilicon etch step was detected using a thin film interferometry endpoint detection technique, where the light beam wavelength ranged from about 350 nm to about 400 nm; the spot size diameter was about 8 mm to about 10 mm; and the difference in refractive index between the polysilicon and silicon oxide was about 1.4 or greater. Exemplary processing conditions for performing the method of the invention are set forth below.

As a preface to the detailed description, it should be noted that, as used in this specification and the appended claims, the singular forms "a", "an", and "the" include plural referents, unless the context clearly dictates otherwise.

I. An Apparatus for Practicing the Invention

Figure 1:
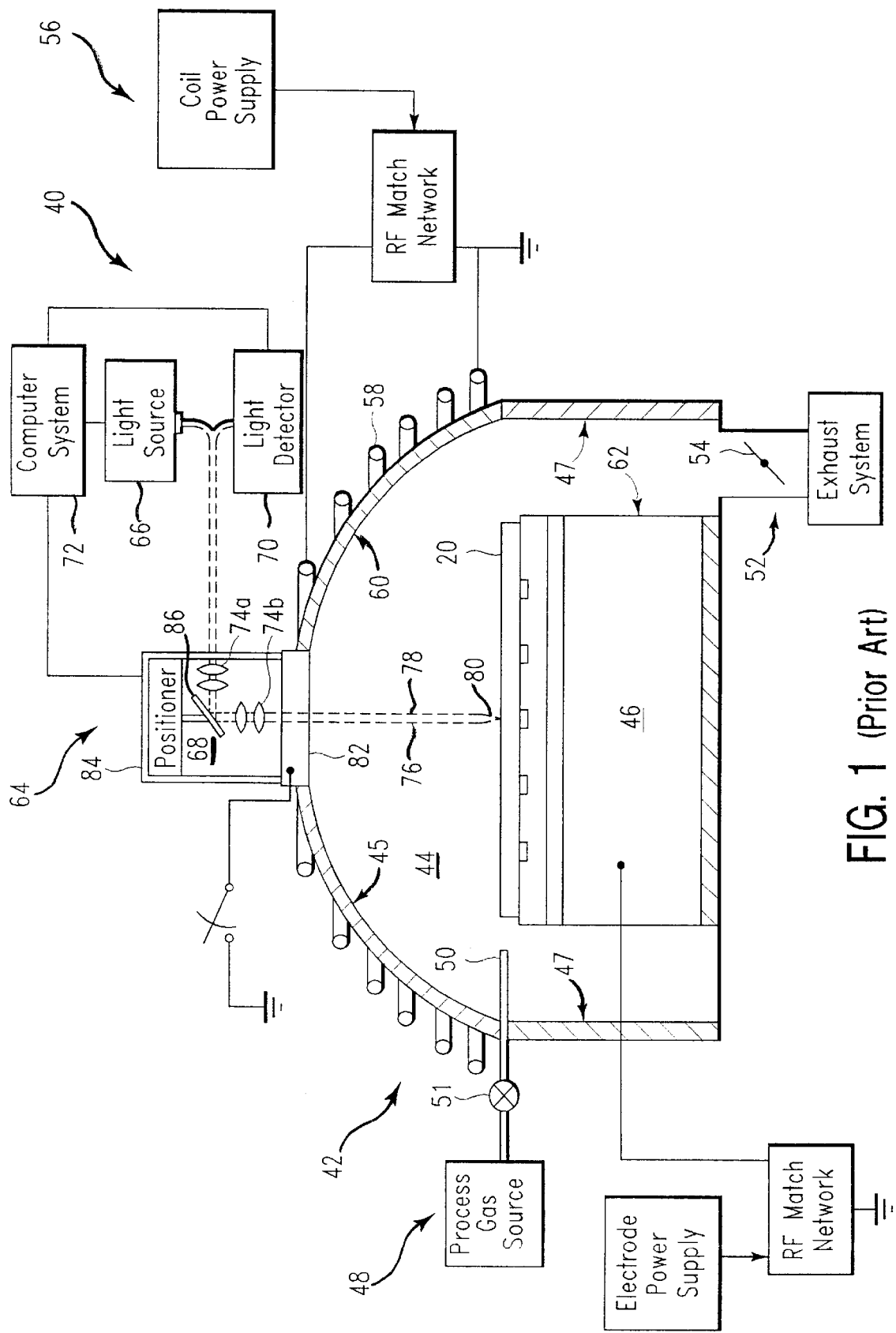
FIG. 1 is a schematic sectional side view of a semiconductor processing apparatus 40 and endpoint detection system 64 which can be used to practice the method of the present invention.

A schematic sectional side view of a semiconductor processing apparatus which includes an endpoint detection system of the kind which can be used to practice the method of the present invention is shown in FIG. 1. The apparatus 40 comprises a processing chamber 42 having a process zone 44 for processing a substrate 20, and a supporting member 46, such as an electrostatic chuck, that holds the substrate 20 in the processing zone 44. The process zone 44 surrounds substrate 20 typically comprises a volume of about 10,000 to about 50,000 cm$^3$; however, this is not a critical variable in terms of the method. The ceiling 45 of the processing chamber 42 can be flat or rectangular shaped, arcuate, conical, dome-shaped, or multi-radius dome shaped.

Processing gases are introduced into the chamber 42 through a gas distribution system 48 that includes a process gas supply and a gas flow control system (not shown) that comprises a gas flow control valve 51. The gas distribution system 48 may comprise gas outlets 50, located at or around the periphery of the substrate 20 (as shown), or a showerhead (not shown) mounted on the ceiling 45 (typically centrally positioned) of the chamber 42 with outlets therein (not shown). Spent processing gases and etchant byproducts are exhausted from the processing chamber 42 through an exhaust system 52 (typically including a 1000 liter/sec roughing pump and a 1000 to 2000 liter/sec turbomolecular pump, not shown) capable of achieving a minimum pressure of $10^{-3}$ mTorr in the chamber 42. A throttle valve 54 is provided in the exhaust system 52 to control the flow of spent processing gases and the pressure of processing gas in the chamber 42.

A plasma is generated from the processing gases using a plasma generator 56 that couples an electric field into the process zone 44 of the chamber 42, or in a remote zone adjacent to the processing chamber 42. The plasma generator 56 shown in FIG. 1 comprises an inductor antenna 58 consisting of one or more inductor coils having a circular symmetry with a central axis coincident with the longitudinal vertical axis that extends through the center of the chamber 42 and is perpendicular to the plane of the substrate 20. When the inductor antenna 58 is positioned near the dome ceiling 45, the ceiling of the chamber 42 comprises a dielectric material, such as aluminum oxide, which is transparent to RF fields and is also an electrical insulator. The frequency of the RF voltage applied to the inductor antenna 58 in the exemplary methods described herein is typically about 50 kHz to about 60 MHZ, and more typically about 13.56 MHZ. The power level of the RF voltage applied to the antenna is typically about 100 W to about 5000 W.

In addition to the inductor antenna 58, one or more process electrodes 60, 62 may be used to accelerate or energize the plasma ions in the chamber 42. The process electrodes 60, 62 include a ceiling 45 or sidewalls 47 of the chamber 42 which are electrically grounded or biased to serve as a first electrode 60 that capacitively couples with a second electrode 62 below the substrate 20, to form a capacitive electric field that generates or energizes the plasma in the chamber. Typically, the first and second electrodes 60, 62 are electrically biased relative to one another by the electrode voltage supply, which includes an AC voltage supply for providing a plasma-generating RF voltage to the second electrode 62, and a DC voltage supply for providing a chucking voltage to the electrode 60. The AC voltage supply provides an RF-generating voltage having one or more frequencies from 13.56 MHZ to 400 kHz, at a current power level of about 50 W to about 3000 W.

Although the exemplary methods are described using an inductively coupled plasma source, other plasma sources, such as a remote plasma source (RPS), electron cyclotron resonance (ECR), and capacitively coupled parallel plate reactors of the kind known in the industry, are also contemplated within the present invention.

The processing chamber, 42 in the present examples, further comprises an endpoint detection system 64 for detecting an endpoint of a process being performed in the chamber. Endpoint detection system 64 generally comprises a light source 66 for emitting a light beam, a focusing assembly 68 for focusing an incident light beam 76, which illuminates an area or "spot" 80 on the surface of substrate 20, and a light detector 70 that measures the intensity of a reflected light beam 78 that is reflected from the beam spot 80 on substrate 20 surface. A computer 72 calculates portions of the real-time measured waveform spectra of light reflected from the beam spot 80 on substrate 20 and compares these with a stored characteristic waveform pattern.

The light source 66 comprises a monochromatic or polychromatic light source that generates an incident light beam 76, which illuminates a beam spot 80 on substrate 20. When the layer onto which the illuminated spot 80 is directed has a sufficient thickness, a reflected light beam 78 is reflected from beam spot 80. The intensity of the incident light beam 76 is selected to be sufficiently high as to provide a reflected light beam 78 which has a measurable intensity. In one version, the light source 66 provides polychromatic light, such as a Hg—Cd lamp, which generates an emission spectrum of light in wavelengths from about 200 nm to about 600 nm. The polychromatic light source 66 can be filtered to provide an incident light beam 76 having selected frequencies, or particular emission spectra wavelengths can be used, or color filters can be placed in front of the light detector 70 to filter out all wavelengths except the desired wavelength of light prior to measuring the intensity of the reflected light beam 78 entering the light detector 70. The light source 66 can also comprise a flash lamp or a monochromatic light source that provides a selected wavelength of light, for example, a He—Ne or ND-YAG laser.

One or more convex focusing lenses 74a, 74b are used to focus an incident light beam 76 from the light source 66 to form a beam spot 80 on the substrate 20 surface, and to focus the reflected light beam 78 back on the active surface of light detector 70. The size or area of the beam spot 80 should be sufficiently large to compensate for variations in surface topography of the substrate 20 and device design features. This enables detection of etch endpoints for high aspect ratio features having small openings, such as vias or deep narrow trenches, which may be densely present or more isolated. The area of the reflected light beam should be sufficiently large to activate a large portion of the active light-detecting surface of the light detector 70. The incident and reflected light beams 76, 78 are directed through a transparent window 82 in the process chamber 42 that allows the light beams to pass in and out of the processing environment.

The beam spot 80 used in the present method had a diameter of about 8 mm to about 10 mm. This is typically sufficient for most applications. However, if the beam spot 80 encompasses large isolated areas of the substrate, containing only a small number of etched features, it may be necessary to use a larger beam spot in order to encompass a greater number of etched features. The size of the beam spot can therefore be optimized, depending on the design features for a particular device.

Optionally, a light beam positioner 84 is used to move the incident light beam 76 across the substrate 20 to locate a suitable portion of the substrate surface on which to position the beam spot 80 to monitor an etching process. The light beam positioner 84 comprises one or more primary mirrors 86 that rotate at small angles to deflect the light beam from the light source 66 onto different positions of the substrate surface (as shown). Additional secondary mirrors can be used (not shown) to intercept the reflected light beam 78 that is reflected from the substrate 20 surface and focus the reflected light beam 78 on the light detector 70. In another embodiment, the light beam positioner 84 is used to scan the light beam in a raster pattern across the substrate 20 surface. In this version, the light beam positioner 84 comprises a scanning assembly consisting of a movable stage (not shown), upon which the light source 66, focusing assembly 68, collecting lens, and detector 70 are mounted. The movable stage can be moved through set intervals by a drive mechanism, such as a stepper motor, to move the beam spot 80 across the substrate 20 surface.

The light detector 70 comprises a light-sensitive electronic component, such as a photovoltaic cell, photodiode, or phototransistor, which provides a signal in response to a measured intensity of the reflected light beam 78 that is reflected from the substrate 20 surface. The signal can be in the form of a change in the level of a current passing through an electrical component or a change in a voltage applied across an electrical component. The reflected light beam 78 undergoes constructive and/or destructive interference which increases or decreases the intensity of the light beam, and the light detector 70 provides an electrical output signal in relation to the measured intensity of the reflected light beam 78. The electrical output signal is plotted as a function of time to provide a waveform spectra having numerous waveform patterns corresponding to the varying intensity of the reflected light beam 78.

A computer program on a computer system 72 compares the shape of the measured waveform pattern of the reflected light beam 78 to a stored characteristic waveform pattern and determines the endpoint of the etching process when the measured waveform pattern is the same as the characteristic waveform pattern. According to another embodiment, the program operates on the measured waveform to detect a characteristic waveform, such as, for example an inflection point. The operations can be simple mathematic operations such as evaluating a moving derivative to detect an inflection point.

II. Exemplary Method of the Invention for Recess Etching of Polysilicon

The exemplary method of the invention is a combination of steps where a specialized endpoint detection system is used to determine when to end one step and begin another. A typical starting structure upon which the combination of steps is performed is described below.

Figure 7A:
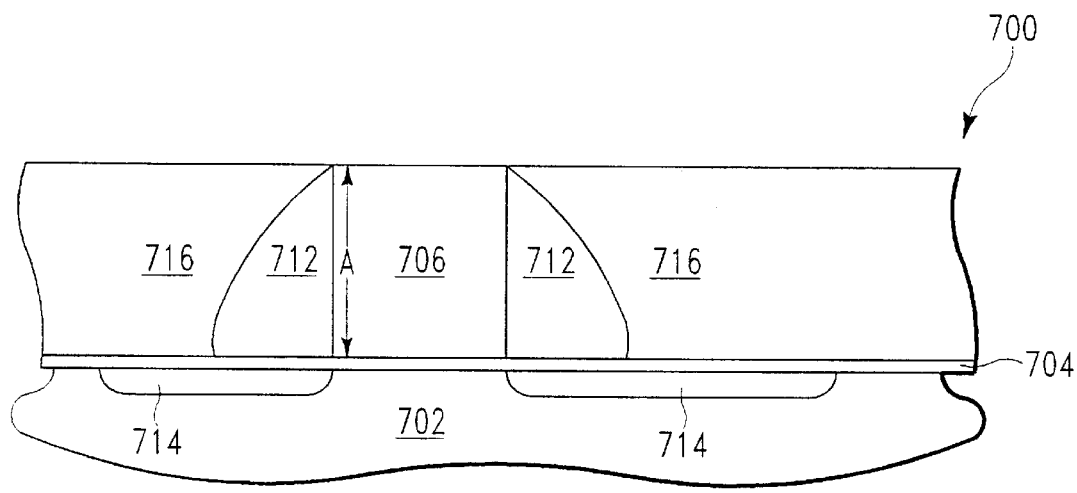
FIGS. 7A–7C illustrate an exemplary embodiment of the method of the invention for etching of polysilicon within a recess.

FIG. 7A shows a starting structure of the kind upon which the method of the present invention is performed. The starting structure 700 includes a semiconductor substrate 702, having lightly doped source and drain regions 714 formed therein, and a gate dielectric layer 704 overlying semiconductor substrate 702. Formed on top of gate dielectric layer 704 are polysilicon fill layer (or "plug") 706 and field dielectric layer 716, which is separated from the polysilicon 706 by dielectric spacers 712.

The substrate 702 is typically single-crystal silicon, but may alternatively be silicon-germanium, gallium arsenide, or silicon-on-insulator (SOI). Source and drain regions 714 are formed in substrate 702 using conventional ion implantation techniques known in the art.

Gate dielectric layer 704 typically comprises an inorganic oxide, such as, for example, silicon oxide or tantalum pentoxide. A silicon oxide gate dielectric layer 704 is typically formed to have a thickness within the range of about 15 Å to about 100 Å. Other materials having different electrical properties may be applied at a different thickness. When tantalum pentoxide is used, the thickness of the gate dielectric layer may be lower than when silicon oxide is used. Such gate dielectric layers are typically formed or deposited using conventional methods known in the art, such as thermal oxidation or plasma-enhanced chemical vapor deposition (PECVD).

The polysilicon 706 is typically deposited using chemical vapor deposition (CVD) to have a thickness within the range of about 1000 Å to about 3000 Å. The dielectric spacers 712 typically comprise silicon nitride or may alternatively comprise silicon oxide or silicon oxynitride. The field dielectric layer 716 typically comprises silicon oxide. The various layers of starting structure 700 can be formed using conventional deposition and plasma etching methods known in the art.

According to one embodiment of applicants' method, a first portion of the polysilicon 706 is etched into the recess using a plasma generated from a first plasma source gas which provides a fast, aggressive etch. The following plasma source gases and processing conditions provide good results for the first polysilicon etch step: a plasma gas mixture of $HBr/Cl_2/He/O_2$ (where $O_2$ is about 30 volume % of the $He/O_2$ mixture) at relative volumetric ratios of about 1/0.6/0.05, respectively; 4 mTorr process chamber pressure; 450 W plasma source power; 80 W substrate bias power; and 55° C. substrate temperature.

The endpoint of polysilicon etching was set to leave a thin residue (about 150 Å) of polysilicon at the bottom of the recess, to protect the underlying thin dielectric layer. The endpoint was detected using an interferometric endpoint (IEP) detection system with a thin film interferometry endpoint detection technique. This technique relies on differences in the reflectivities from various materials in the etch stack to determine an endpoint for a given etch step. In particular, the wave form pattern of a reflected light beam reflected from a spot on a substrate surface was measured over time. The measured waveform pattern is compared to a predetermined characteristic waveform pattern, and when the two waveform patterns were similar or substantially the same, the etch process was ended. Alternatively, a measured waveform may be monitored to detect the appearance of a characteristic waveform pattern such as an inflection point, for example. After detection of the "endpoint", which indicated that the surface of the underlying layer of dielectric material was fast approaching, the processing conditions were typically changed to provide a new etch process in which the etch rate and etch selectivity were different. This change in process was used to provide a "soft landing" during etch within a recess, so that etching did not proceed beyond the level desired within the recess, causing harm to the underlying layer of dielectric material.

Figure 7B:
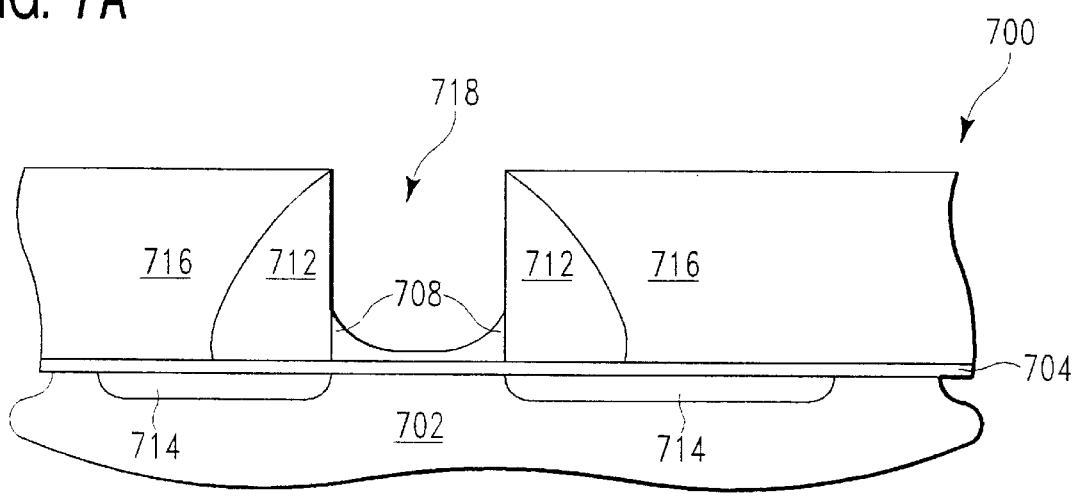

Referring to FIG. 7B, when the thickness of the residual polysilicon 708 within the trench 718 is sufficiently low (after etching for a period of time), the intensity of the reflected light beam that reflects off of the polysilicon 706 is measured and plotted over time to obtain a measured waveform pattern. The measured waveform pattern is compared to a predetermined characteristic waveform pattern to determine an endpoint of the etching process that occurs when the two waveforms are the same or are substantially identical to one another. Upon detection of the endpoint, the etch process may be discontinued entirely, or a second etch process under different conditions may be initiated.

In the present instance, and as described in Grimbergen et al., preliminary experiments were conducted to identify a wavelength of light that is suitable for providing desired absorption or reflection characteristics. Thereafter, that wavelength of incident light is used in the endpoint detection process. Typically, the incident light beam comprises substantially only certain dominant wavelengths or a single wavelength of visible light (or the light beam is filtered to obtain dominant wavelengths or a single wavelength), to provide a discernible waveform spectra and a high intensity characteristic waveform pattern. For example, the wavelength may corresponds to a high intensity wavelength of an emission spectra of the light source 66 (shown in FIG. 1). In addition, it is also advantageous if the incident light beam consist of substantially only non-polarized light. Polarized light is preferentially absorbed by a change in the characteristics of the plasma in the chamber or the chamber window, as illustrated in FIG. 1. For example, deposition of a thin residue on a chamber window can change the absorption characteristics of the chamber window, resulting in preferential absorption of polarized light. It is helpful to use non-polarized light to reduce or prevent such changes in the intensity of the reflected light to reduce errors in the measurement or comparison of waveform patterns of the light.

Figure 2A:
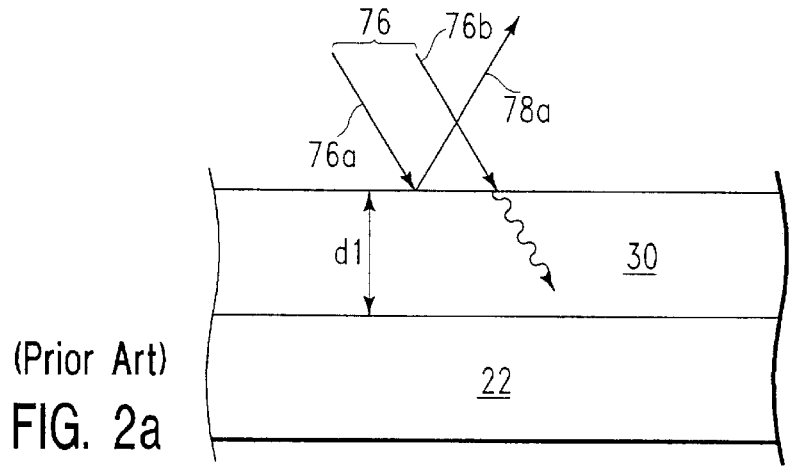
FIGS. 2A–2C are schematic views illustrating an incident light beam 76 having a wavelength such that one portion of the light is reflected from the top surface of a polysilicon layer 30 (FIG. 2A), while another portion of the light is absorbed, or partially absorbed and partially reflected from the top surface of an underlying silicon oxide layer 22 (FIGS. 2B and 2C).
Figure 2B:
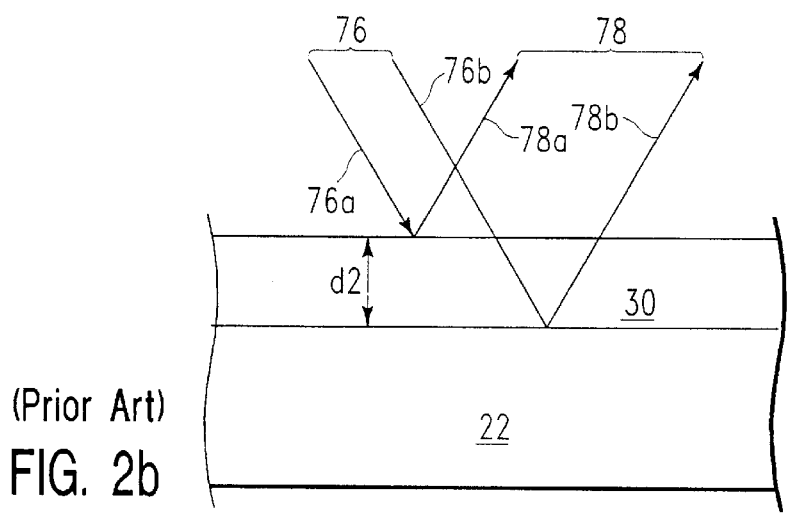
Figure 2C:
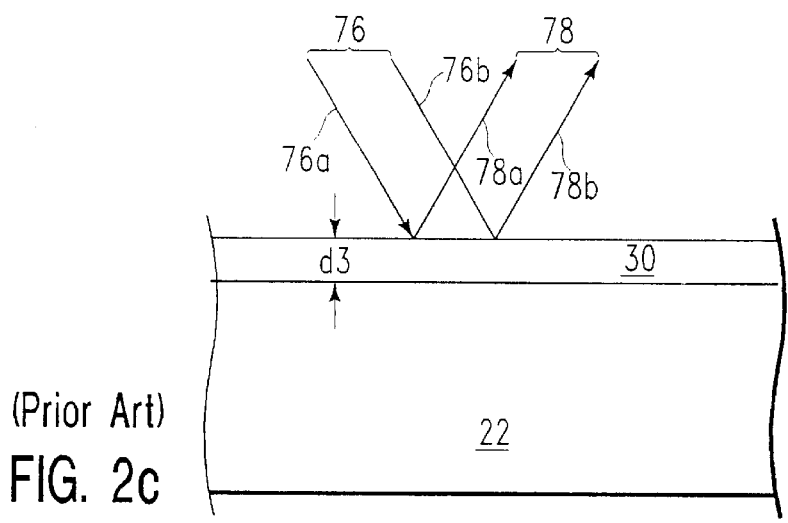

Referring to FIGS. 2A–2C, which were taken from the Grimbergen '334 patent, a light beam 76 (schematically represented by two components, 76a and 76b) having the preselected wavelength of light will be partially absorbed and partially reflected from the top surface of a layer 30 of a first medium when incident on the layer 30. The selected wavelength may also be at least partially reflected from the surface of an underlying layer 22 of a second medium as the layer 30 of the first medium is etched and becomes thinner and more transparent. As the thickness of layer 30 decreases, the remaining thickness of layer 30 becomes transparent to particular wavelengths of incident light 76. When layer 30 is etched to transparent thickness levels, a first portion or component 76a of the incident light beam 76 is reflected from the top surface of the light beam 76, and a second portion or component 76b of the incident light beam 76 enters layer 30 and is refracted through the thickness of layer 30 and reflected back upwards from the bottom surface of layer 30. While other reflections and refractions of the incident light beam 76 also occur, in a simplified representation, the transparent layer reflects a first component 76a of the light beam from the top surface of layer 30, and a second component 76b of the light beam from the top surface of layer 22. The first and second light beam components, 76a and 76b, are formed only after a sufficient thickness of layer 30 has been etched, and they constructively or destructively interfere to form the reflected light beam.

Figure 3:
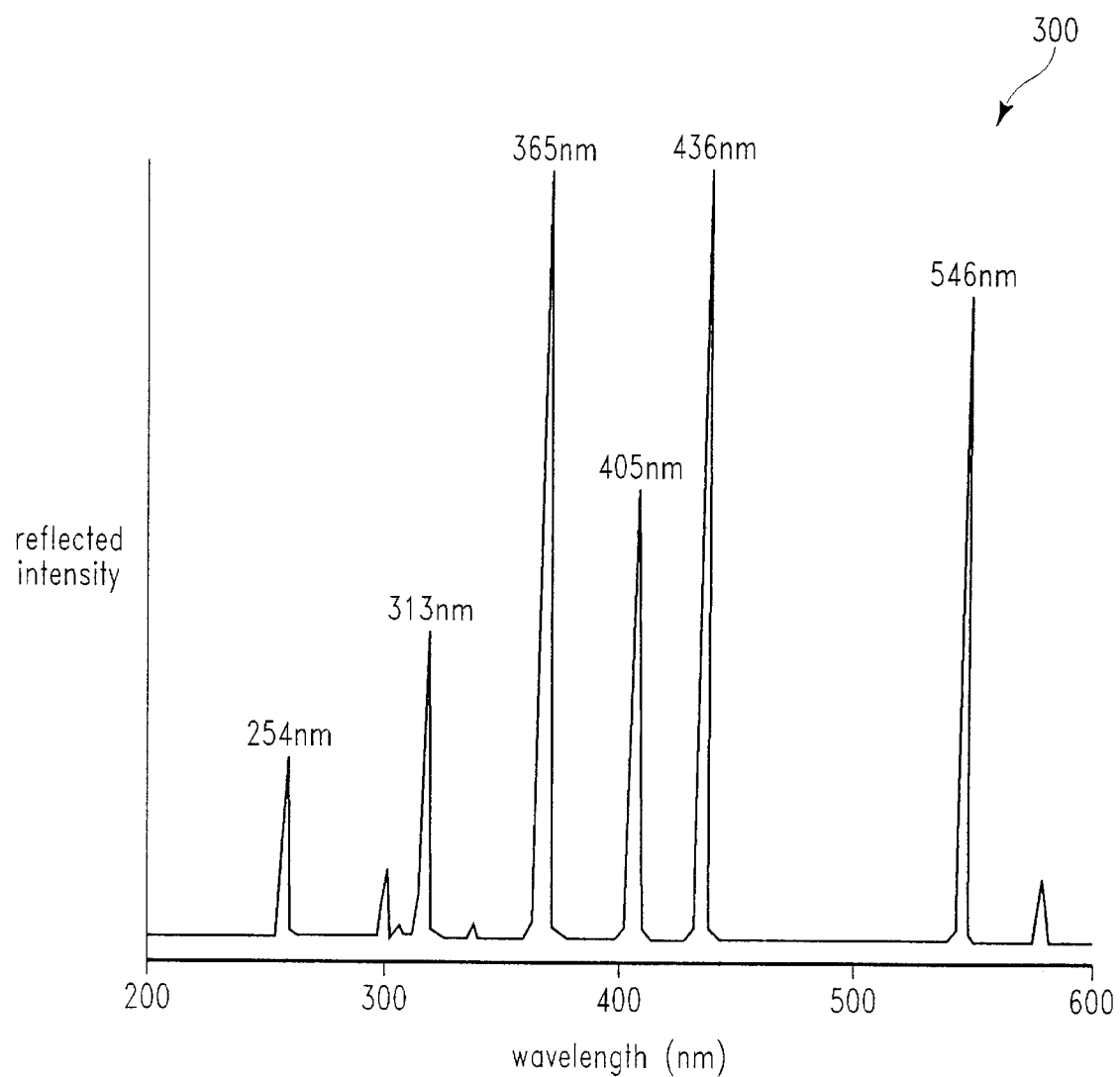
FIG. 3 is a graph 300 of the peak intensities of a light beam reflected from the surface of a polysilicon layer, showing peaks at various wavelengths of an Hg lamp.

In the present method for etching of polysilicon within a recess such as a trench, a suitable wavelength, which will provide an inflection endpoint, depends on the emission spectra of the light source 66 (shown in FIG. 1), as well as the optical properties of the polysilicon in the recess (trench), the trench wall material, and the layer of material underlying the polysilicon. For example, FIG. 3 is a graph 300 of the peak intensities of reflected light obtained from an incident light beam from a Hg lamp, that are reflected from the surface of polysilicon layer having a thickness of about 500 nm, overlying a 100 nm silicon dioxide layer. The peaks on graph 300 represent the interaction between the light provided at different emission spectrum wavelengths of the Hg lamp, and the polysilicon and silicon dioxide layers. For example, the intensity of the peaks at wavelengths exceeding 365 nm is much higher than the peak intensities at the lower wavelengths of 254 nm or 313 nm. The wavelengths exhibiting higher peaks are typically selected because a higher intensity provides a lower error level due to the higher signal-to-noise ratio of the reflected waveform spectra. The optimal wavelengths depend upon the composition of the layer to be etched and the underlying layer of material, as well as the initial and final thicknesses of the etched layer; therefore, an empirical determination of the most helpful wavelength is desirable. In the example shown with respect to FIG. 4, the wavelengths of 254, 313, 365, 405, 436, and 546 were selected for testing and evaluating of the pattern and intensity of their reflected waveform spectra.

Referring again to FIG. 1, to evaluate the reflected waveform spectra, as each substrate 20 is being etched, a particular wavelength of light 76 is directed on the substrate 20 and the reflected (or absorbed) waveform spectra of the reflected light beam 78 is monitored by the light detector 70. A light beam from a light source 66 (for example but not by way of limitation, a Hg—Cd lamp) is focused on the substrate 20 at a near vertical angle, to provide a beam spot 80 having a size sufficiently large to cover one or more of the features being etched on the substrate 20. The intensity of the reflected light beam 78 is measured over time to obtain a measured waveform pattern.

The interference phenomenon is described by the equation $2d = N(\lambda/\eta)$, where $\lambda$ is the wavelength of the laser light, $\eta$ is the refractive index of a layer, and d is the thickness of the layer. For integral values N=1, 2, 3, etc., the interference is constructive, and the intensity of the reflected light is at a maximum. For N=1/3, 3/2, 5/2, etc., the interference is destructive, and the intensity of the reflected light beam is at a minimum value.

Figure 4:
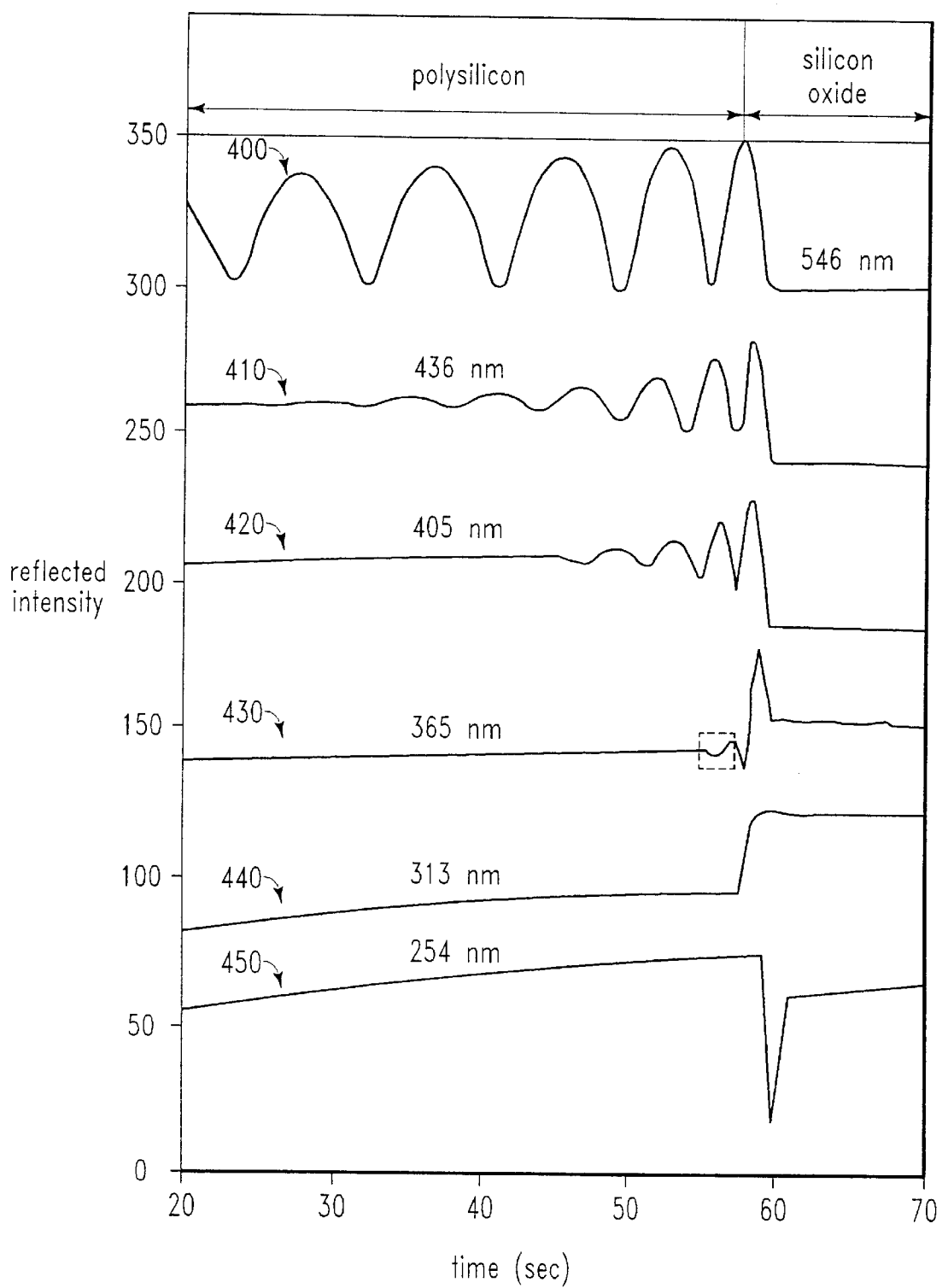
FIG. 4 shows endpoint traces 400, 410, 420, 430, 440, and 450, obtained during etching of a flat, overlying layer of polysilicon relative to an underlying silicon oxide layer. These endpoint traces were obtained using the thin film interferometry endpoint detection technique disclosed by Grimbergen et al. (U.S. Pat. No. 6,081,334), using light beam wavelengths of 546 nm, 436 nm, 405 nm, 365 nm, 213 nm, and 254 nm, respectively.

Referring to FIG. 4, the waveform spectra comprises multiple waveform oscillations for higher wavelengths, and at certain wavelengths provides a sufficient number of periodic oscillation peaks such that a characteristic waveform pattern for endpoint detection can be accurately selected. For example, at wavelengths of 254 nm (curve 450), the intensity of the reflected light beam 78 shows only a single valley before the end of the polysilicon etching process, and at 313 nm (curve 440), the intensity of the reflected light beam 78 provides a single peak. Both of which are not highly desirable, because they provide too few periodic waveform oscillations. The 365 nm wavelength (curve 430) provides two distinct peaks, each having a shape that is easily recognizable. At wavelengths above 405 nm (curve 420), larger numbers of peaks are obtained, which may also be less desirable. At 546 nm (curve 400) and 436 nm (curve 410), the number of multiple peaks renders the waveform spectra undesirable, because each of the peaks have to be "recognized" by the computer program, and the presence of multiple peaks can result in endpoint detection errors. Generally, it is advantageous to use a simple spectra with one or two peaks that are easily recognizable, and that require less storage or analysis of multiple peaks or other waveform oscillation shapes. Therefore, suitable waveform spectra (from this set of waveform spectra) are provided at the 365 nm and 405 nm wavelengths, both spectra exhibiting a small number of oscillations. Thus, for etching of a polysilicon layer, it has been discovered that an advantageous wavelength ranges between about 350 nm and about 400 nm.

Once a particular wavelength and associated waveform spectra are empirically determined, a particular waveform pattern is chosen that provides an easily characterizable waveform pattern, immediately prior to termination of etching of a polysilicon layer, and at the time the remaining thickness of the etched polysilicon layer approaches a preselected endpoint thickness. The characteristic waveform pattern should have a shape or oscillation which is relatively easily recognizable by the computer system program and which provides a low rate of errors in endpoint detection. The characteristic waveform pattern should also have distinct features that will be easily recognizable to the computer system, even if the reflected light beam is attenuated or has a high signal-to-noise ratio. The shape recognition properties also depend upon the structure of the comparative programming code module of the computer program and the sensitivity of the light detector. In addition, the characteristic waveform should be sufficiently repeatable, from one substrate to another, to reduce endpoint detection errors when processing a large batch of substrates.

It is helpful when the characteristic waveform pattern comprises a repeatable waveform oscillation pattern that occurs immediately prior to a terminal peak or dip in the reflected waveform pattern shape that corresponds to or denotes a completed stage of etching of the polysilicon layer.

Figure 8:
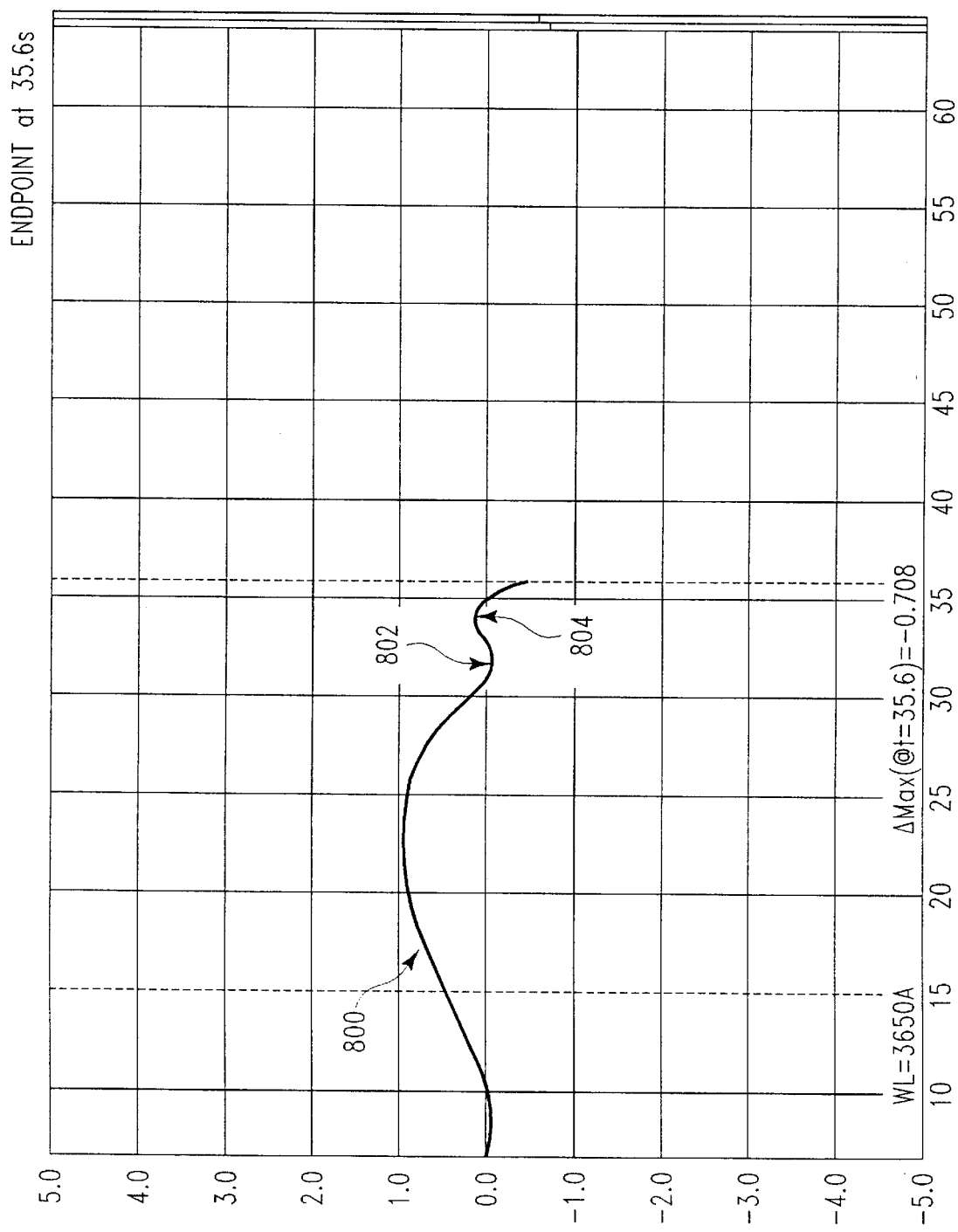
FIG. 8 is a representative endpoint trace 800 for recess etching of polysilicon relative to an underlying silicon oxide gate dielectric layer according to an exemplary method of the invention. Note the dip 802 before the peak 804 in endpoint trace 800, which represents a "characteristic waveform" (such as an inflection point) which is detected by the computer program and signals the endpoint of the first polysilicon etch step of the present invention.

FIG. 8 shows a representative endpoint trace 800 for the etching of polysilicon in a trench overlying a thin gate layer of silicon oxide, according to the method of the invention. The endpoint trace 800 was obtained using the thin film interferometry endpoint apparatus described herein. The wavelength used during etching of the polysilicon was 365 nm. The dip 802 before the peak 804 in endpoint trace 800 represents an inflection in the waveform pattern which was detected by the computer program and which provided a clear indication of the endpoint for a polysilicon etch step during the practice of the present invention. The polysilicon etched was a fill material present in a recess in a silicon oxide layer. At the base of the recess was a thin layer (about 30 Å thick) of silicon oxide, which silicon oxide overlaid a single crystal silicon substrate. The feature size of the recess was about $0.12\mu$, and the depth of the recess was about 1,500 Å; initial thickness of the polysilicon material in the recess was about 1,500 Å. It was desired to end the etch process with about 100 Å to about 200 Å of polysilicon remaining at the bottom of the trench. FIGS. 7A and 7B illustrate the trench initially and after termination of the polysilicon etching step.

As discussed in the "Brief Description of the Background Art", conventional thin film interferometric endpoint detection techniques were not expected to be sufficiently sensitive to detect the small change in the amount of reflected light as the polysilicon in polysilicon-filled trenches was etched. This was because the amount of light reflected from the polysilicon surfaces is small in comparison with the being reflected off the dielectric substrate surface. This is particularly true for cases where the polysilicon-filled trenches are isolated features.

Surprisingly, we were able to obtain a clear and distinct inflection endpoint for etching of polysilicon within a recess. For the present invention to work (i.e., to obtain a clear and distinct inflection endpoint), it is necessary to select an appropriate wavelength of light and an appropriate beam spot size. Further, the fact that the polysilicon being etched and the surrounding silicon oxide substrate surface have very different refractive indices is important. Polysilicon has a refractive index which ranges from about 2.8 to about 3.8, whereas silicon oxide has a refractive index of about 1.4–1.5. This endpoint detection method can be applied to the etching of other materials in a recess when these three parameters are properly addressed.

Figure 5:
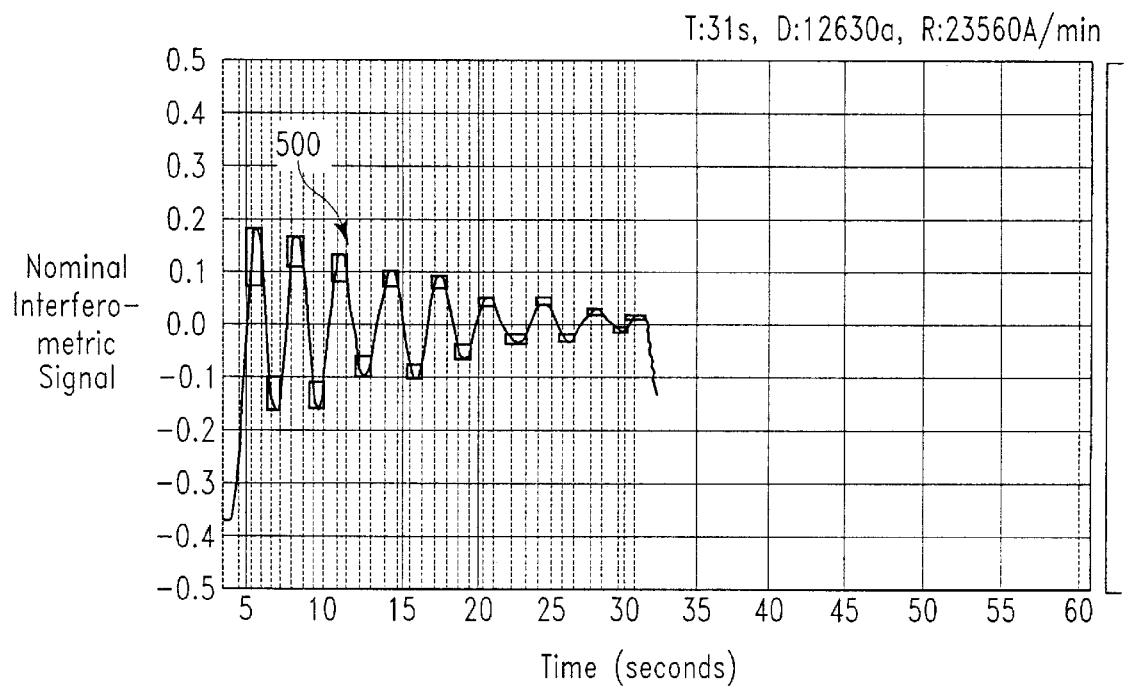
FIGS. 5 and 6 are representative endpoint traces 500, 600, for recess etching of polysilicon within a trench which were obtained using the multi-layer interferometry endpoint detection technique disclosed by Kaplita et al. (referenced in the "Brief Description of the Background Art").
Figure 6:
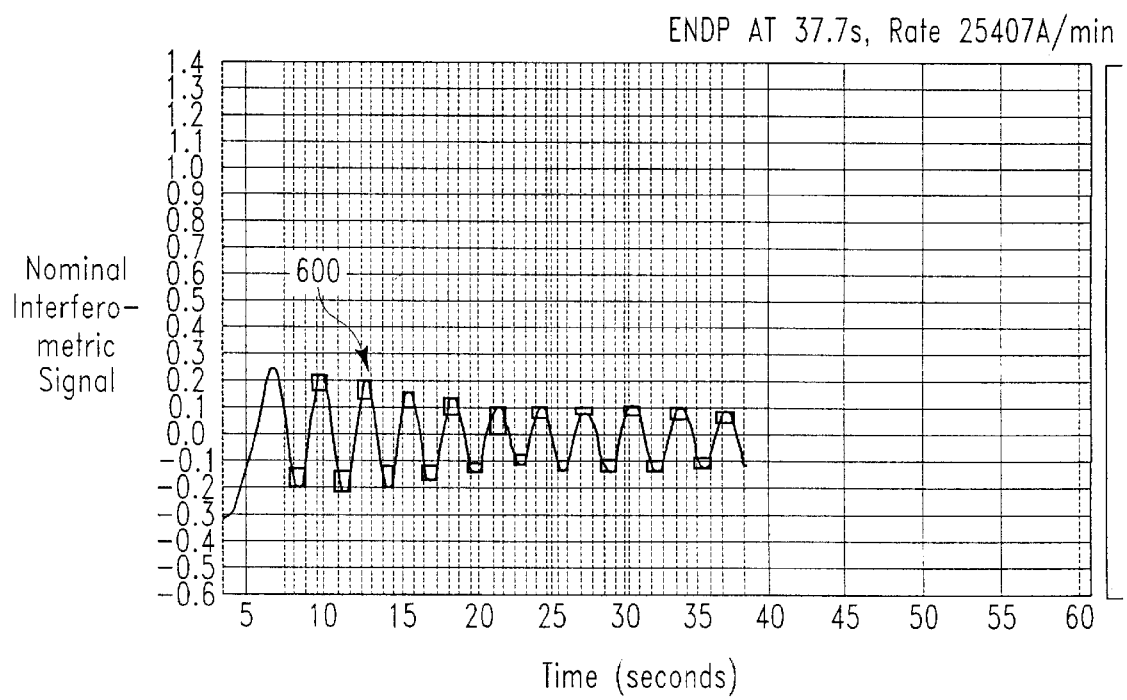

The present invention is not applicable to all substrate materials. For example, the Kaplita et al. reference, which describes endpoint detection for etching polysilicon in a shallow trench formed in a single-crystal silicon substrate, is demonstrative. FIG. 5 from the Kaplita et al. reference shows an endpoint trace, where curve 500 illustrates the waveform pattern obtained for the recess etching of polysilicon within a shallow trench formed in a single-crystal silicon substrate, with no underlying gate dielectric layer. FIG. 6 is an attenuated endpoint trace, where curve 600 shows the result of increased trench/plug aspect ratio. In either case, the change in the waveform pattern is a continuum.

As discussed in the "Brief Description of the Background Art", Kaplita uses a multi-layer interferometry endpoint detection technique to signal the endpoint for recess etching of polysilicon. The difference between the refractive indices of the polysilicon being etched and the underlying single-crystal silicon is not sufficient to provide a significant change in the amount of reflected light as the endpoint for polysilicon etching approaches. Kaplita's endpoint detection technique provides a sinusoidal wave pattern of decreasing amplitude, without an inflection point which indicates a clear and distinct endpoint for polysilicon etching.

With respect to the etching of polysilicon within a trench according to the present method, as illustrated in FIG. 7B, about 100 Å to about 200 Å of polysilicon 708 typically remains at the bottom of the trench 718 when the endpoint is signaled. Etching time for the first polysilicon etch step is typically within the range of about 30 seconds to about 40 seconds, when the initial thickness "A" of the polysilicon 706 (shown in FIG. 7A) ranges from about 1000 Å to about 3000 Å at the start of etching.

Figure 7C:
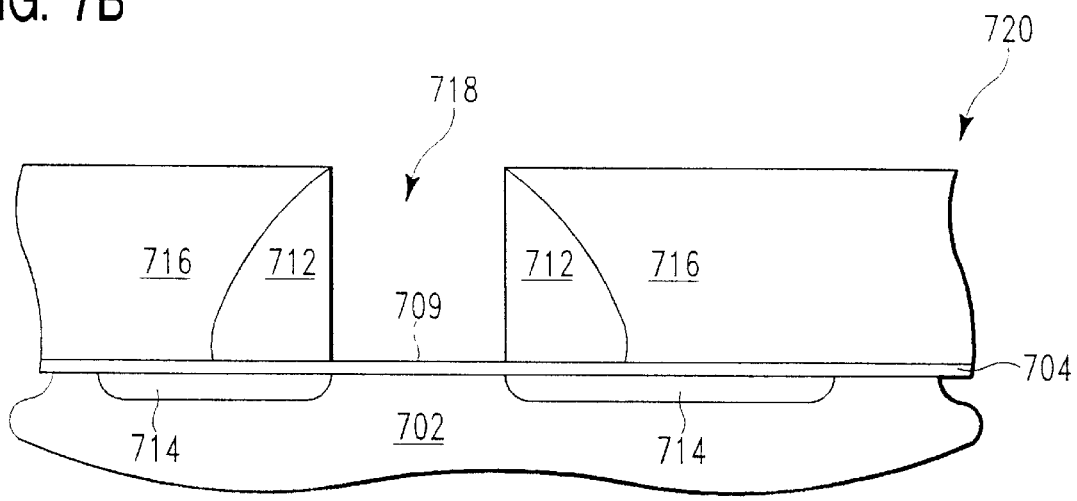

After the endpoint of the polysilicon etch step is detected (for example, when the inflection point shown in FIG. 8 is reached), the etch chemistry may be switched to a second, less aggressive etch chemistry to remove the remaining portion of the polysilicon 708, and to expose an upper surface 709 of gate dielectric layer 704, as shown in the step between FIGS. 7B and 7C. The second plasma source gas is typically selected to reduce the polysilicon etch rate to provide a more controlled etching of the polysilicon and to provide greater selectivity for etching the polysilicon 708 relative to the gate dielectric layer 704, in order to avoid damaging the gate dielectric layer 704 during removal of the remaining portion of the polysilicon 708. It is advantageous when, the second plasma source gas provides a selectivity for etching polysilicon relative to the gate dielectric material of at least 100:1. As used herein, the term "etch selectivity" refers to a ratio of the etch rate of a first material (e.g., polysilicon) to the etch rate of a second material (e.g., the gate dielectric material) using a given plasma source gas and processing conditions.

The polysilicon etch rate and polysilicon: gate dielectric etch selectivity can also be controlled by varying certain process conditions such as, for example and not by way of limitation, lowering the substrate bias power and/or substrate temperature. For example, when the gate dielectric layer 704 comprises either silicon oxide or tantalum pentoxide, the following plasma source gases and processing conditions provide good results for the second polysilicon etch step: 160 sccm HBr and 5 sccm He/$O_2$ (where $O_2$ is about 30 volume % of the He/$O_2$ mixture); 50 mTorr process chamber pressure; 500 W plasma source power; 500 W substrate bias power; and 55° C. substrate temperature.

The second polysilicon etch step is a timed etch. Etching time for the second polysilicon etch step will vary according to the thickness of the remaining polysilicon 708; however, duration of etching is typically within the range of about 40 seconds to about 60 seconds when the remaining polysilicon 708 has a thickness within the range of about 100 Å to about 200 Å.

The final structure 720 remaining after practicing the method of the invention is shown in FIG. 7C. After performance of the method of the invention, polysilicon layer 706 has been completely removed, and an upper surface 709 of gate dielectric layer 704 has been exposed, as shown in FIG. 7C, without damage to or punching through of the thin dielectric layer.

Subsequent to formation of structure 720, further processing steps can be performed to provide a metal gate structure. For example, a fill layer of a metal (such as, for example and not by way of limitation, tungsten, aluminum, or platinum) can be deposited over the semiconductor structure. The field surface of the metal fill layer is then removed, using techniques known in the art (including, without limitation, plasma etching or chemical-mechanical polishing), to form a metal "plug".

The endpoint detection method can significantly improve substrate yields by reducing etching of, or other damage to, the thin gate dielectric layer during etching of the overlying polysilicon layer. In particular, the polysilicon etching process can be stopped without etching through a gate dielectric layer having a thickness of only 12 Å to 20 Å. Also, by stopping the etching process before the thin gate dielectric layer is damaged by the aggressive etching process step, the method of the invention provides higher yields and better quality of integrated circuits.

The thin film interferometry endpoint detection technique used in the method of the present invention is advantageous over ellipsometry or plasma emission endpoint detection techniques. The present method of comparing a pattern for a measured waveform to a characteristic waveform pattern to identify an etching endpoint stage is far more accurate than prior art endpoint detection methods. Furthermore, a single wavelength of non-polarized light is adequate to measure and determine the etching endpoint, thereby reducing the complexity of light source and detectors which are used to measure the intensity and phase shift of multiple wavelengths of light that are required in ellipsometry.

The above described embodiments are not intended to limit the scope of the present invention, as one skilled in the art can, in view of the present disclosure expand such embodiments to correspond with the subject matter of the invention claimed below.

We claim:

1. A method of etching a first material within a recess formed in a substrate of a second, different material, said method comprising the steps of:

a) etching a first portion of said first material using a plasma generated from a first plasma source gas;

b) detecting an endpoint for etching said first portion of said first material relative to an underlying layer of a third material which is different from said first material, wherein said endpoint is detected using thin film interferometric endpoint detection, wherein an interferometric incident light beam wavelength is tailored to said first material being etched, a spot size of a surface of said substrate illuminated by said incident light beam is sufficient to provide adequate signal intensity from said first material being etched, and a refractive index of said first material being etched is sufficiently different from a refractive index of other materials contributing to reflected light from said substrate that the combination of said light beam wavelength, said spot size, and said difference in refractive index provides a clear and distinct endpoint signal; and c) removing a remaining portion of said first material by etching using a plasma generated from a second plasma source gas, wherein said second plasma source gas provides a selectivity for etching said first material relative to said underlying layer of said third different material, where said selectivity is at least 100:1.

2. The method of claim 1, wherein said first material etching endpoint is detected by the steps of:

b-1) directing an incident light beam onto a surface of said substrate;

b-2) measuring the intensity of reflected light over time to obtain a measured waveform pattern; and b-3) comparing said measured waveform pattern to a predetermined waveform pattern to determine said etching endpoint.

3. The method of claim 1, wherein said first material etching endpoint is detected by the steps of:

b-1) directing said incident light beam onto a surface of said substrate containing said first material;

b-2) measuring the intensity of reflected light over time to obtain a measured waveform pattern; and b-3) comparing said measured waveform pattern to a predetermined waveform pattern to determine said etching endpoint.

4. The method of claim 3, wherein said characteristic feature is a waveform shape.

5. The method of claim 4, wherein said waveform shape is independent of the number of maxima or minima in a waveform pattern.

6. The method of claim 3, wherein said method comprises monitoring the intensity of light having substantially a single wavelength.

7. The method of claim 3, wherein said light is substantially non-polarized light.

8. The method of claim 7, wherein a thickness of about 100 Å to about 200 Å of polysilicon remains at the bottom of said recess when said endpoint is detected.

9. A method of etching polysilicon within a recess formed in a substrate of a first material different from polysilicon, comprising the steps of:

a) etching a first portion of said polysilicon using a plasma generated from a first plasma source gas;

b) detecting an endpoint for etching of said first portion of said polysilicon relative to an underlying layer of a second material different from polysilicon, wherein said endpoint is detected using a thin film interferometry endpoint detection technique; and c) removing the remaining portion of said polysilicon by etching with a plasma generated from a second plasma source gas, wherein said second plasma source gas provides a selectivity for etching said polysilicon relative to said underlying layer of at least 100:1, whereby an upper surface of said underlying layer is exposed.

10. The method of claim 9, wherein said underlying layer is a gate dielectric layer.

11. The method of claim 10, wherein said gate dielectric layer comprises a material selected from the group consisting of silicon oxide and tantalum pentoxide.

12. The method of claim 11, wherein a second plasma source gas comprises HBr, $O_2$, and He.

13. The method of claim 11, wherein said gate dielectric layer comprises a layer of silicon oxide having a thickness within the range of about 15 Å to about 100 Å.

14. The method of claim 9, wherein greater than 50 area % of surfaces surrounding said recess comprise a dielectric material.

15. The method of claim 14, wherein said dielectric material is selected from the group consisting of silicon oxide, silicon nitride, and silicon oxynitride.

16. The method of claim 9, or claim 10, or claim 11, or claim 13, or claim 14, or claim 15, wherein said recess has a feature size of less than about $0.1\mu$ and an aspect ratio of greater than 1.0.

17. The method of claim 16, wherein said feature size ranges from about $0.1\mu$ to about $0.15\mu$.

18. The method of claim 9, wherein said first plasma source gas comprises HBr, $Cl_2$, $O_2$, and He.

19. The method of claim 9, wherein said first material etching endpoint is detected by the steps of:

b-1) directing an incident light beam onto a surface of said substrate;

b-2) measuring the intensity of reflected light over time to obtain a measured waveform pattern; and b-3) comparing said measured waveform pattern to a predetermined waveform pattern to determine said etching endpoint.

20. The method of claim 9, wherein said first material etching endpoint is detected by the steps of:

b-1) directing an incident light beam onto a surface of said substrate;

b-2) monitoring the intensity of light reflected from said substrate surface over time to obtain a waveform; and b-3) recognizing a characteristic feature of said waveform that occurs before said polysilicon is completely etched.

21. The method of claim 20, wherein said characteristic feature is a waveform shape.

22. The method of claim 21, wherein said waveform shape is a dip before a peak.

23. The method of claim 21, wherein said waveform shape is independent of the number of maxima or minima in said waveform pattern.

24. The method of claim 21, wherein said waveform shape comprises a curved portion.

25. The method of claim 20, wherein said method comprises monitoring the intensity of light having substantially a single wavelength.

26. The method of claim 20, wherein said light is substantially non-polarized light.

27. The method of claim 20, wherein said method comprises recognizing a characteristic waveform shape that occurs immediately prior to a terminal peak or dip in said waveform, said terminal peak or said dip corresponding to completion of etching of said polysilicon.

28. The method of claim 20, wherein said light has a wavelength within the range of about 350 nm to about 400 nm.

29. The method of claim 28, wherein said light has a wavelength of about 365 nm.

* * * * *